United States Patent [19]

Mohammad et al.

[11] Patent Number: 5,382,815
[45] Date of Patent: Jan. 17, 1995

[54] CARRIER CONDUCTION CONDUCTOR-INSULATOR SEMICONDUCTOR (CIS) TRANSISTOR

[75] Inventors: Shaikh N. Mohammad, Hopewell Junction; Robert B. Renbeck, Staatsburg; Keith M. Walter, Poughkeepsie, all of N.Y.

[73] Assignee: International Business Machines Corporation, Armonk, N.Y.

[21] Appl. No.: 173,388

[22] Filed: Dec. 23, 1993

[51] Int. Cl.$^6$ .............. H01L 31/072; H01L 31/109; H01L 29/00; H01L 27/082
[52] U.S. Cl. .................... 257/197; 257/198; 257/557; 257/565; 257/616
[58] Field of Search ............ 257/197, 198, 183, 565, 257/616, 557

[56] References Cited

U.S. PATENT DOCUMENTS

| | | | |
|---|---|---|---|
| 5,105,250 | 4/1992 | Tam et al. | 357/34 |
| 5,137,840 | 8/1992 | Desilets et al. | 437/32 |
| 5,177,583 | 1/1993 | Endo et al. | 257/190 |
| 5,198,689 | 3/1993 | Fujioka | 257/161 |

FOREIGN PATENT DOCUMENTS 2-91948  3/1990  Japan ................ 257/197

OTHER PUBLICATIONS

IEEE Electron Device Letter, vol. EDL-4, No. 7, Jul. 1983, "Super-Gain Silicon MIS Heterojunction Emitter Transistors" by Green et al., pp. 225–227.
J. C. Bean, et al., "Ge$_x$Si$_{1-x}$/Si strained-layer superlattice grown by molecular beam epitaxy" J. Vac. Sci. Technology, A, V. 2, #2, pp. 436–440, Apr.–Jun. 1984.
R. People, et al., "Band alignments of coherently strained Ge$_x$Si$_{1-x}$/Si heterostructures on <001>-Ge$_y$Si$_{1-y}$substrates" Appl. Phys. Lett., V. 48, No. 8, p. 538540, Feb. 1986.
S. C. Jain, et al., "Structure, properties and applications of Ge$_x$Si$_{1-x}$stained layers and superlattices" Semiconductor Science Technology, V. 6, pp. 547–576, 1991.

*Primary Examiner*—Steven Ho Yin Loke
*Attorney, Agent, or Firm*—Charles W. Peterson, Jr.

[57] ABSTRACT

A Conductor Insulator Semiconductor (CIS) heterojunction transistor. The CIS transistor is on silicon (Si) substrate. A layer of n type Si is deposited on the substrate. A trench is formed through the n type Si layer, and may extend slightly into the substrate. The trench is filled with an insulator, preferably SiO$_2$. A layer of p type Si$_{1-z}$Ge$_z$ (where z is the mole fraction of Ge and $0.1 \leq z \leq 0.9$) is deposited on the n type Si layer. A p+ base contact region is defined in the p type Si$_{1-z}$Ge$_z$ region above the oxide filled trench. A n type dopant is ion implanted into both the Si$_{1-z}$Ge$_z$ and n Si layers and may extend slightly into the substrate, forming a collector region. A thin oxide layer is deposited on the Si$_{1-z}$Ge$_z$ layer and a low work function metal such as Al, Mg, Mn, or Ti is selectively deposited on the thin oxide and to define an emitter. Alternatively, the emitter may be p+ polysilicon. Next, the thin oxide is opened to define collector and base contacts. A suitable metal, such as Al is deposited in the base and collector contacts.

20 Claims, 3 Drawing Sheets

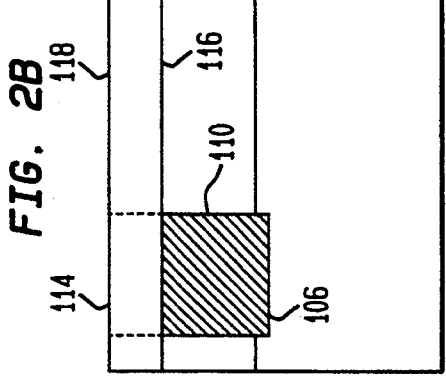
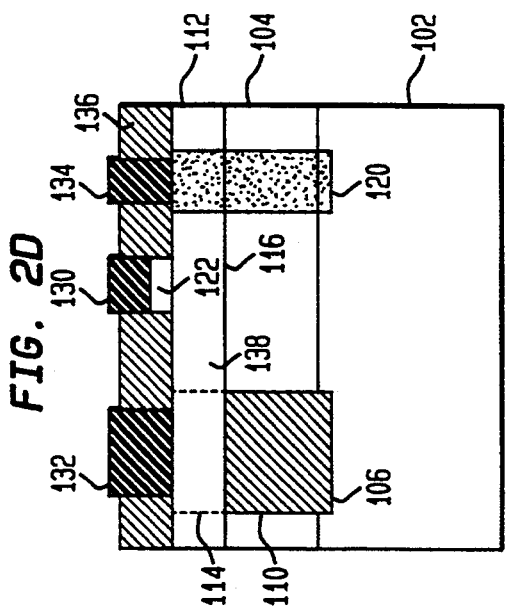
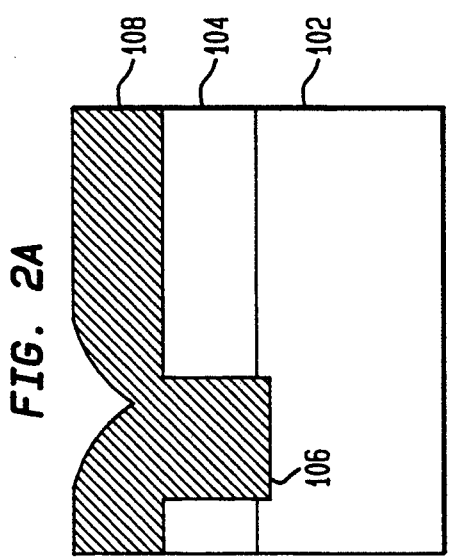
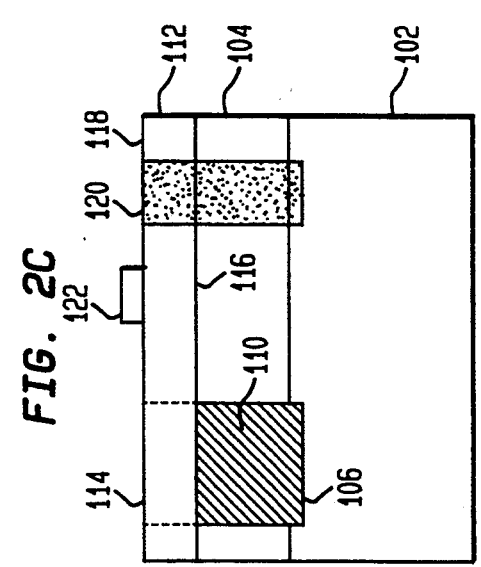

CARRIER CONDUCTION CONDUCTOR-INSULATOR SEMICONDUCTOR (CIS) TRANSISTOR

FIELD OF THE INVENTION

The present invention is related to bipolar transistors and more particularly to Metal-Insulator-Semiconductor transistors.

BACKGROUND OF THE INVENTION

Bipolar transistors are known in the art. Metal Insulator Semiconductor (MIS) transistors are known in the art. A prior art Lateral MIS transistor is represented in FIG. 1. A very thin layer of insulator 50 such as $SiO_2$, between the metal emitter 52 and metal collector 54 and semiconductor base 56 prevents current flow between the base 56 and emitter 52 or collector 54. However, when $V_{be}$ is large enough, the emitter 52 injects electrons through the insulator 50 to the base 56. The emitter 52 and collector 54 are further isolated from each other, laterally, by thick oxide 58, which separates them by distance $d_B$. The base contact 60 is separated from the collector 54 by thick field oxide 62, at a distance d. The base contact 60 is through a highly doped region 64 (P+ or N+) which insures ohmic contact to the base 56. Since the collector 54 is reverse biased with respect to the base 56, electrons are drawn from the body to the surface of the base 56 at the thin oxide 50 under the collector 54 to form a depletion region there (not shown). This depletion region, which is set in part by base dopant level, controls base 56 to collector 54 current. With optimum thin oxide thickness at the collector 54 and optimum base dopant level, the collector can saturate at low levels, exhibiting collector current characteristics similar to traditional bipolar transistors.

Additionally, controlling the depletion regions controls collector current saturation. Increasing the depletion region increases the Electric field (E-field) across the collector thin oxide, increasing collector current.

Unfortunately, there are several phenomena that limit the current gain and, as a consequence, any performance improvement realized from lateral MIS transistors. Primarily shunt current, mainly high base-to-emitter current leakage, limits lateral MIS transistor current gain. Shunt current occurs because carriers from the emitter 52 tend to follow downward into the base 56, rather than horizontally into the collector 54. Some carriers recombine in the lower regions of the base 56 rather than exit into the collector 54. Thus, these recombining carriers, which are part of the base current, exhibit the characteristics of a resistive (linear) current, i.e. exhibit the characteristic of a shunt resistor between the base 56 and the emitter 52. Consequently, the shunt current, which is not amplified, reduces current gain.

Heterojunction bipolar transistors (HBTs) are known in the art. A heterojunction has at least two layers of at least two dissimilar semiconductor materials. These two materials have different energy at the conduction and valence band edges ($E_c$ and $E_v$ respectively) and different electron affinities. Thus, the heterojunction layer interface creates band gap spikes $\Delta E_c$ and $\Delta E_v$. $\Delta E_c$ and $\Delta E_v$ reinforce current flow in one (forward biased) direction and reduce current flow in the other (reverse biased) direction. Because electrons effectively will tunnel through the conduction potential spike, $\Delta E_c$, this increased forward current flow is also known as tunnel current. Thus, properly biased HBTs have an increased DC current gain over traditional homojunction bipolar transistors.

PURPOSES OF THE INVENTION

It is the purpose of the present invention to increase Conductor-Insulator-Semiconductor transistor DC current gain.

It is another purpose of the present invention to improve Conductor Insulator Semiconductor transistor performance.

It is another purpose of the present invention to increase base to emitter shunt resistance in Conductor-Insulator-Semiconductor transistors.

It is yet another purpose of this invention to increase DC current gain and decrease extrinsic collector resistance in Conductor-Insulator-Semiconductor transistors.

SUMMARY OF THE INVENTION

The present invention is a Conductor-Insulator-Semiconductor (CIS) transistor comprising: a substrate layer (preferably silicon); a first conduction layer of a first semiconductor material (preferably silicon) on said substrate layer; a second conduction layer of a second semiconductor material (preferably SiGe) on said first conduction layer; an insulator filled trench in said first conduction layer (that may reach into the substrate); a thin oxide pad on said second conduction layer; a conductor (which may be p+ poly or a low work function metal, (first) electrode (emitter) on said thin oxide layer; and a second (base) and a third (collector) electrode of metal on said second conduction layer.

BRIEF DESCRIPTION OF THE DRAWINGS

FIGS. 2A-2D show the steps in fabricating a preferred embodiment of the present invention.

DETAILED DESCRIPTION OF THE PREFERRED EMBODIMENT

Figure 1:
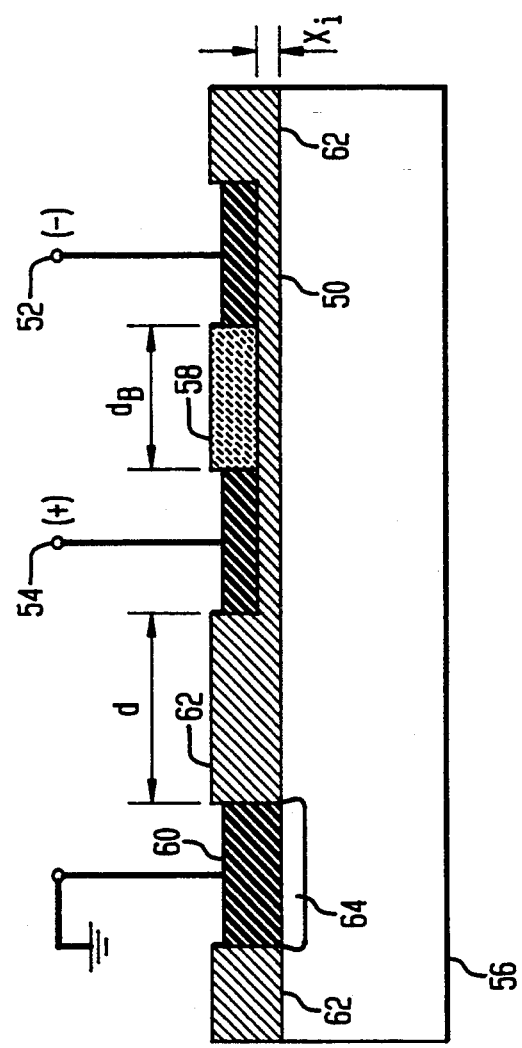
FIG. 1 is a cross section of a prior art MIS transistor.

FIGS. 2A-D are a representation of the steps in fabricating the preferred embodiment Conductor-Insulator-Semiconductor (CIS) transistor. First, in FIG. 2A, on semi-insulating or insulating substrate 102, an n+ silicon layer 104 is grown by any conventional method, such as Molecular Beam Epitaxy (MBE) or High Vacuum Metal Organic Chemical Vapor Deposition (HV-MOCVD). The n+ layer 104 is between 1500Å to 2500Å thick and n-doped with a dopant concentration between $1\times10^{18}$ and $1\times10^{19} cm^{-3}$. A trench 106 is formed through n+ layer 104 and may extend into substrate 102. An insulator layer 108, preferably of $SiO_2$, is grown over or deposited on the n+ layer 104, filling the trench. The insulator layer 108 is removed from the surface of n+ layer 104, leaving an insulator plug 110 filling the trench 106 in FIG. 2B.

Then, a 200-500Å layer 112 of $Si_{1-z}Ge_z$ (where z is the mole fraction of Ge) is grown by MBE or Chemical Vapor Deposition (CVD) on n layer 104 and plug 110. $Si_{1-z}Ge_z$ is doped with a p-type dopant, such as boron, to between $1\times10^{15}$ and $1\times10^{16} cm^{-3}$ and $0.1 \leq z \leq 0.9$, preferably $0.15 \leq z \leq 0.30$. Further, z is selected to maximize quantum well depth at the $Si/Si_{1-z}Ge_z$ interface, and to minimize defects so that the $Si_{1-z}Ge_z$ layer is psuedomorphic. A quantum well forms at the Si/Si$_{1-z}$Ge$_z$ interface 116. Area 114 is photolithographically defined and ion implanted with a p-type impurity, preferably boron, to a dopant level between $5\times10^{18}$ and $5\times10^{19}$ cm$^{-3}$. The implanted dopant is heat activated at or below 900° C.

Next, in FIG. 2C, the emitter and collector are photolithographically defined. The collector regions 120 are photolithographically defined and ion implanted with n-type dopant, preferably arsenic, antimony or phosphorous. The dopant is implanted vertically into Si$_{1-z}$Ge$_z$ layer 112, to a depth sufficient to extract carriers in the quantum well. The dopant may extend through Si layer 104 and slightly into substrate 102 in collector regions 120. Again, low temperature annealing (at or below 900° C.) is done to activate and secondarily to redistribute implanted ions. Resulting dopant concentration is preferably $5\times10^{18}$ to $1\times10^{19}$ cm$^{-3}$. A 20–50Å thick insulator is deposited on the surface 118 and selectively, photolithographically removed to leave a thin oxide pad 122 on the surface 118 at the emitter region.

Next, in FIG. 2D, base and collector contacts and an emitter electrode are defined. A layer of p+ polysilicon or low work function metal, such as aluminum, magnesium or tin is deposited on thin oxide pads 122 forming the emitter 130, and completing the CIS tunnel structure, 130-122-112. Alternatively, a thin oxide layer may be deposited on the surface 118, a conductor layer is deposited on the thin oxide layer; and, then, both layers etched to form the oxide pads 122 and the emitter 130 in a single step. The base contact 132 and collector contact 134 are formed from any suitable metal, preferably aluminum. If the emitter 130 is of a low work function metal, collector contact 134 and base contact 132 may be formed simultaneously with the emitter electrode 130, using this same deposited low work function metal. However, p+ polysilicon, not metal is preferred for a hole conductor CIS transistor. In the preferred embodiment, after forming the emitter 130, a layer of 2000–3000Å of oxide 136 is deposited to cover exposed Si$_{1-z}$Ge$_z$ areas. Base and Collector contacts are defined and opened through layer 136. Then metal is deposited to form base 132 and collector 134 contacts.

Figure 3A:
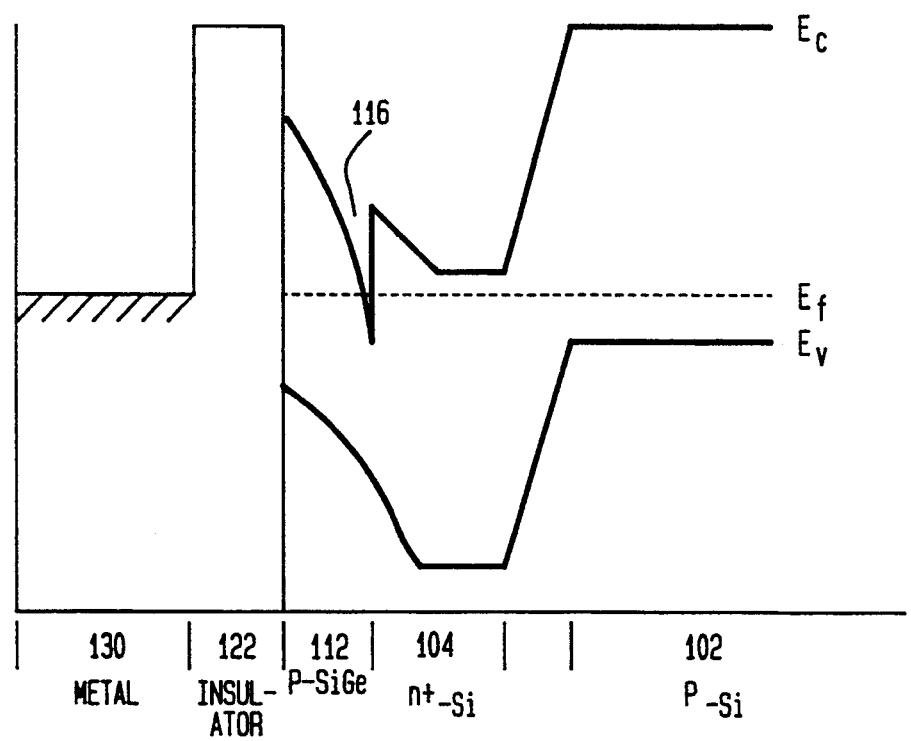
FIGS. 3A-3B is an energy band gap diagram of cross sections under the emitter of the preferred embodiment CIS transistor.
Figure 3B:
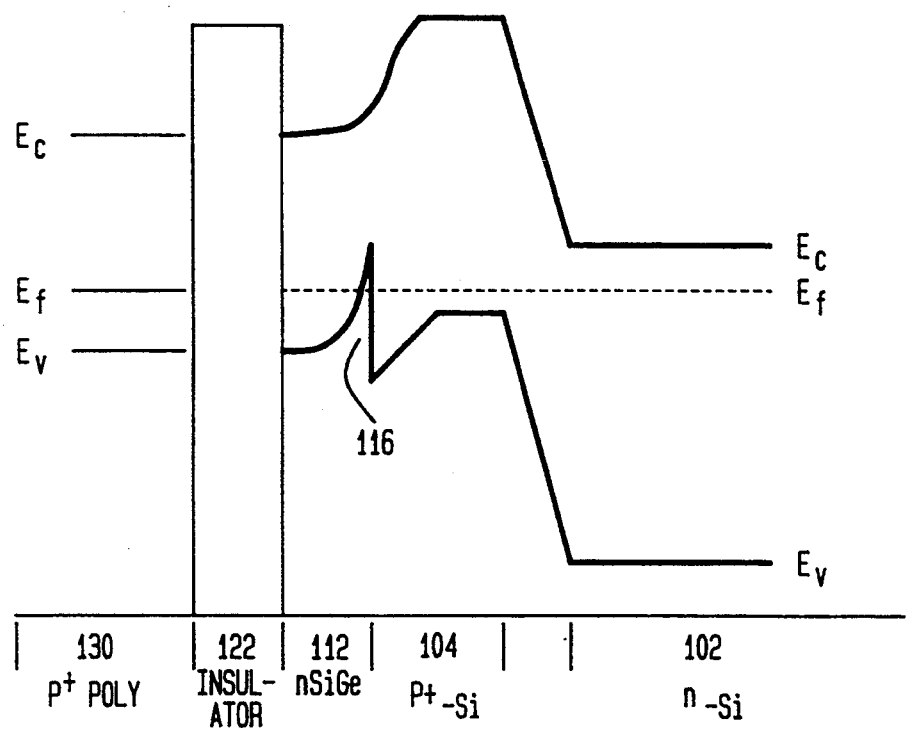

FIG. 3A is an electron energy band diagram for the preferred embodiment of the electron conduction CIS transistor. FIG. 3B is a corresponding hole energy band diagram for the complementary hole conduction CIS transistor. As can be seen from the electron energy band diagram of FIG. 3A, the emitter oxide 122 forms a high potential barrier. This potential barrier prevents shunt current flow between the transistor's base 114 and its emitter 130. However, when V$_{be}$ is large enough, hot electrons tunnel through the emitter oxide 122 and enter intrinsic regions of SiGe layer 112. Since these electrons enter the base at a relatively high velocity, and since the SiGe layer 112 appears thin for the high velocity carriers, only minor carrier recombination occurs. Carrier recombination is reduced because of the velocity, carriers remain in the base for a shorter period of time, and, because electrons in the quantum well are screened somewhat from recombination sources. Consequently, base current leakage is low and, DC current gain is high, significantly higher than for prior art transistors. The valence band quantum well in the hole conduction CIS transistor and the conduction band quantum well in the electron conduction CIS transistor occur at the Si/SiGe interface 116. These quantum wells provide a very high mobility path for carriers from intrinsic collector region at the Si/SiGe interface 116, under region 138 to the extrinsic collector contact 120. This high mobility path suppresses leakage because carriers are funneled along the path and, consequently, further improves DC current gain device performance.

While the present invention is described in terms of preferred embodiments, numerous modifications and variations will occur to a person of ordinary skill in the art without departing from the spirit and scope of the claims. It is intended that those modifications and variations fall within the scope of the appended claims.

We claim:

1. A Conductor Insulator Semiconductor (CIS) transistor comprising:
   a substrate;
   a first conduction layer of a first semiconductor material on said substrate layer;
   a second conduction layer of a second semiconductor material on said first conduction layer;
   a thin insulating pad on said second conduction layer;
   a first electrode on said thin insulating pad; and
   a second electrode and a third electrode on said second conduction layer,
   wherein the second conduction layer includes a region of a first conduction type and a region of a second conduction type, said second conduction type region extending from said third electrode downward through said second conduction layer.

2. The CIS transistor of claim 1 further comprising a trench in said first conduction layer, said trench filled with an insulating material.

3. The CIS transistor of claim 2 wherein said first semiconductor material is Silicon (Si) and said second semiconductor material is Silicon-Germanium (Si$_{1-z}$Ge$_z$), where z is the mole fraction of Ge in SiGe.

4. The CIS transistor of claim 3 wherein said substrate is Si, said trench is filled with SiO$_2$ and said thin insulating pad is a thin pad of SiO$_2$.

5. The CIS transistor of claim 4 wherein said trench extends through said first conduction layer into said substrate.

6. The CIS transistor of claim 3 wherein $0.1 \leq z \leq 0.9$.

7. The CIS transistor of claim 6 wherein $0.15 \leq z \leq 0.3$.

8. The CIS transistor of claim 1 wherein the second conduction type region extends into said first conduction layer.

9. The CIS transistor of claim 1 wherein said first conduction type is p-type and said second conduction type is n-type.

10. The CIS transistor of claim 9 wherein the first electrode is Al.

11. The CIS transistor of claim 9 wherein the first electrode is Mn.

12. The CIS transistor of claim 9 wherein the first electrode is Mg.

13. The CIS transistor of claim 9 wherein the first electrode is Ti.

14. The CIS transistor of claim 9 wherein the n-type region further extends through said first conduction layer into said substrate.

15. The CIS transistor of claim 1 wherein said first semiconductor material is Silicon (Si) and said second semiconductor material is Silicon-Germanium (Si$_{1-z}$Ge$_z$), where z is the mole fraction of Ge in SiGe.

16. The CIS transistor of claim 1 wherein said substrate is Si and said thin insulating pad is a thin pad of SiO$_2$.

17. The CIS transistor of claim 1 wherein said first conduction type is n type and said second conduction type is p-type.

18. The CIS transistor of claim 17 wherein the p-type region further extends through said first conduction layer.

19. The CIS transistor of claim 17 wherein the p-type region further extends through said first conduction layer into said substrate.

20. The CIS transistor of claim 1 wherein said first electrode is a polysilicon emitter, said second electrode is a metal base contact and said third electrode is a metal collector contact.

* * * * *